(12) United States Patent
Kitajima et al.

(10) Patent No.: US 7,513,389 B2
(45) Date of Patent: Apr. 7, 2009

(54) ELECTRONIC COMPONENT FEEDING DEVICE AND ELECTRONIC COMPONENT MOUNTING APPARATUS WITH ELECTRONIC COMPONENT FEEDING DEVICE

(75) Inventors: Takahiro Kitajima, Ota (JP); Masahiro Sugita, Hyogo (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 365 days.

(21) Appl. No.: 10/806,465

(22) Filed: Mar. 23, 2004

(65) Prior Publication Data

US 2005/0210664 A1    Sep. 29, 2005

(51) Int. Cl.
*B65H 5/28* (2006.01)

(52) U.S. Cl. .............................. 221/71; 221/73; 221/91; 29/740

(58) Field of Classification Search ................ 29/740
See application file for complete search history.

(56) References Cited

U.S. PATENT DOCUMENTS

| | | | |
|---|---|---|---|
| 4,768,915 A | | 9/1988 | Fujioka |
| 4,951,383 A | * | 8/1990 | Amao et al. .................. 29/721 |
| 5,342,474 A | * | 8/1994 | Mohara et al. .............. 156/584 |
| 6,032,845 A | * | 3/2000 | Piccone et al. .............. 226/139 |
| 6,202,913 B1 | * | 3/2001 | Takada et al. ................. 221/71 |
| 6,474,527 B2 | * | 11/2002 | Miller ........................ 226/32 |
| 6,631,552 B2 | * | 10/2003 | Yamaguchi ................... 29/739 |

FOREIGN PATENT DOCUMENTS

| | | |
|---|---|---|
| JP | 2000-269686 | 9/2000 |
| JP | 2001-284886 | 10/2001 |
| JP | 2003-142878 | 5/2003 |
| JP | 2004-119578 | 4/2004 |
| JP | 2004-119681 | 4/2004 |

\* cited by examiner

*Primary Examiner*—Gene O. Crawford
*Assistant Examiner*—Timothy R Waggoner
(74) *Attorney, Agent, or Firm*—Morrison & Foerster LLP

(57) ABSTRACT

The invention provides an electronic component feeding device which can stably feed electronic components, and an electronic component mounting apparatus having the electronic component feeding device. In a component feeding unit, an opening provided in a suppressor for picking electronic components is formed in a size corresponding to electronic components stored in a storage tape of 16 mm pitch so as to employ storage tapes of four types, i.e., 4 mm pitch, 8 mm pitch, 12 mm pitch, and 16 mm pitch. When the storage tape of 4 mm pitch is employed, a component pickup position of a suction nozzle and a feed stop position of a head electronic component have been conventionally in a center of the opening. In this invention, however, the CPU 81 controls drive motors in a tape feeding system based on operation switches, so that the feed stop position is set on an upstream side of the opening 27A by feeding the storage tape by 2 mm first, and the component pickup position of the suction nozzle is shifted to the upstream side from the center of the opening by 6 mm. From a next operation, the storage tape is intermittently fed by 4 mm pitches, and the feed stop position and the component pickup position are set in the above corrected position.

6 Claims, 13 Drawing Sheets

ELECTRONIC COMPONENT FEEDING DEVICE AND ELECTRONIC COMPONENT MOUNTING APPARATUS WITH ELECTRONIC COMPONENT FEEDING DEVICE

BACKGROUND OF THE INVENTION

1. Field of the Invention

The invention relates to an electronic component feeding device which is adaptable to electronic components of various sizes, and an electronic component mounting apparatus provided with such an electronic component feeding device.

2. Description of the Related Art

Conventionally, in the electronic component feeding device of this type provided in the electronic component mounting apparatus, for adapting the device to many types of tapes, there is proposed in Japanese Patent Application Publication No. 2000-269686 a technology of changing a tape feeding pitch by using an adjusting member to change a stroke of a linking member in a linking system which intermittently rotates a sprocket member for feeding a tape by pitches, and changing spacing between the electronic components in a tape feeding direction and width of an opening for picking provided in a cover member for preventing a vacant tape in front of a pickup position from jumping after the component is picked up.

However, it is troublesome but necessary to change the width of the opening for picking provided in the cover member and the spacing between the electronic components in the tape feeding direction. When the width of the opening for picking is not changed, the opening is formed in a size corresponding to a larger electronic component. Therefore, when small electronic components are used, the storage tape jumps near a center of the opening in the tape feeding direction, affecting a behavior of the electronic component in the storage tape.

SUMMARY OF THE INVENTION

In the electronic component feeding device of the invention, a feed stop position of a head electronic component to be picked up stored in a storage tape is set in a position nearer to an end than to a center of the opening provided for picking the electronic component when the electronic component is smaller than a predetermined size, enabling stable feeding of the electronic component. Furthermore, the feed stop position and a component pickup position are set automatically or semiautomatically as much as possible, and the feed stop position of the head electronic component to be picked up by a suction nozzle, which is stored in the storage tape, is set in a position nearer to the end than to the center of the opening provided for picking the electronic component when the electronic component is smaller than a predetermined size, enabling stable feeding of the electronic component.

Furthermore, in the electronic component mounting apparatus of the invention, the electronic component fed by the electronic component feeding device is picked up by the suction nozzle and mounted on a printed board P.

DETAILED DESCRIPTION OF THE INVENTION

An electronic component mounting apparatus having an electronic component feeding device of one embodiment of the invention will be described with reference to the attached drawings. This electronic component mounting apparatus is a so-called multifunctional chip mounter, which can mount a variety of electronic components A on a printed board P.

Figure 1:
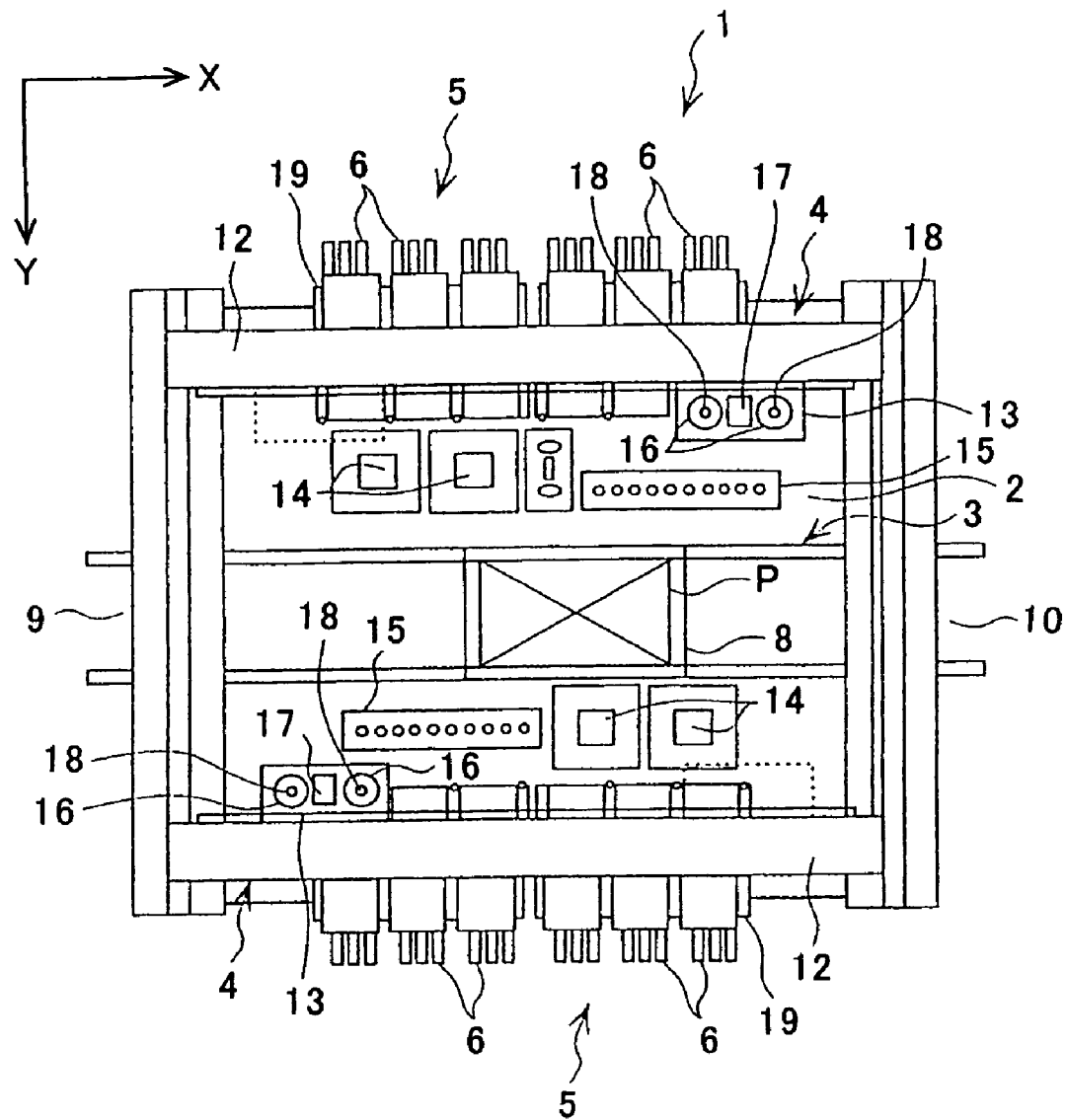
FIG. 1 is a plan view of an electronic component mounting apparatus of an embodiment of the invention.

FIG. 1 is a plan view of the electronic component mounting apparatus. An electronic component mounting apparatus 1 includes a base 2, a conveyer portion 3 extending in a lateral direction in a center of the base 2, and two component mounting portions 4 and two component feeding portions 5 each provided on the front (on a lower side of FIG. 1) and the rear (on an upper side of FIG. 1) of the base 2. Each of the component feeding portions 5 is detachably set with a plurality of component feeding units 6 as the electronic component feeding device.

The conveyer portion 3 includes a central set table 8, a left feeding conveyer 9, and a right discharging conveyer 10. The printed board P is supplied from the feeding conveyer 9 to the set table 8, and is fixed at a predetermined height so as to be mounted with electronic components. After completing the electronic component mounting, the printed board P is discharged from the set table 8 to a downstream device through the discharging conveyer 10.

Each of the component mounting portions 4 is provided with an XY stage 12 movably mounted with a head unit 13, a component recognition camera 14, and a nozzle stocker 15. The head unit 13 is mounted with two mounting heads 16 for picking up and mounting the electronic components, and a board recognition camera 17 for recognizing the printed board P. Normally, the XY stages 12 of both the component mounting portions 4 are alternately driven.

In each of the XY stages 12, a beam moves in a Y direction driven by a Y axis motor, and the head unit 13 moves in an X direction driven by an X axis motor. Therefore, the head unit 13 moves in the X and Y directions.

In each of the component feeding portions 5, many component feeding units 6 are laterally and detachably aligned on a unit base 19. Each of the component feeding units 6 is provided with a storage tape C storing many electronic components aligned at predetermined pitches, which will be described below. By intermittently feeding the storage tape C, the electronic components are fed one by one from an end of the component feeding unit 6 to the component mounting portion 4. In this electronic component mounting apparatus 1, a relatively small electronic component such as a surface mounting component is mainly fed from the component feeding unit 6, and a relatively large electronic component is fed from a tray-type component feeding device (not shown).

This electronic component mounting apparatus 1 is driven based on NC data stored in a storage portion thereof. First, the XY stage 12 is driven, the head unit 13 moves to the component feeding unit 6, and then the mounting head 16 lowers to pick a required electronic component up by a suction nozzle 18 thereof. Then, the mounting head 16 rises up, and the XY stage 12 is driven to move the electronic component to a position right above the component recognition camera 14. The component recognition camera 14 recognizes a posture and a position of the electronic component on the suction nozzle 18. Next, the head unit 13 moves to above the printed board P on the set table 8, and the board recognition camera 17 recognizes a position of the printed board P. Then, an X axis motor 12A and a Y axis motor 12B of the XY stage 12, and a θ axis motor 12C of the suction nozzle 18 (shown in FIG. 11) operate to correct the position of the electronic component by an amount based on a recognition result of the component recognition camera 14 and the board recognition camera 17, and then the electronic component A is mounted on the printed board P.

The XY stage 12 of this embodiment is mounted with two mounting heads 16 (suction nozzles 18) so that two electronic components can be sequentially picked up and sequentially mounted on the printed board P. Furthermore, when the mounting head 16 has more than two suction nozzles 18, although not shown, more than two electronic components can be sequentially picked up and sequentially mounted on the printed board P.

Figure 2:
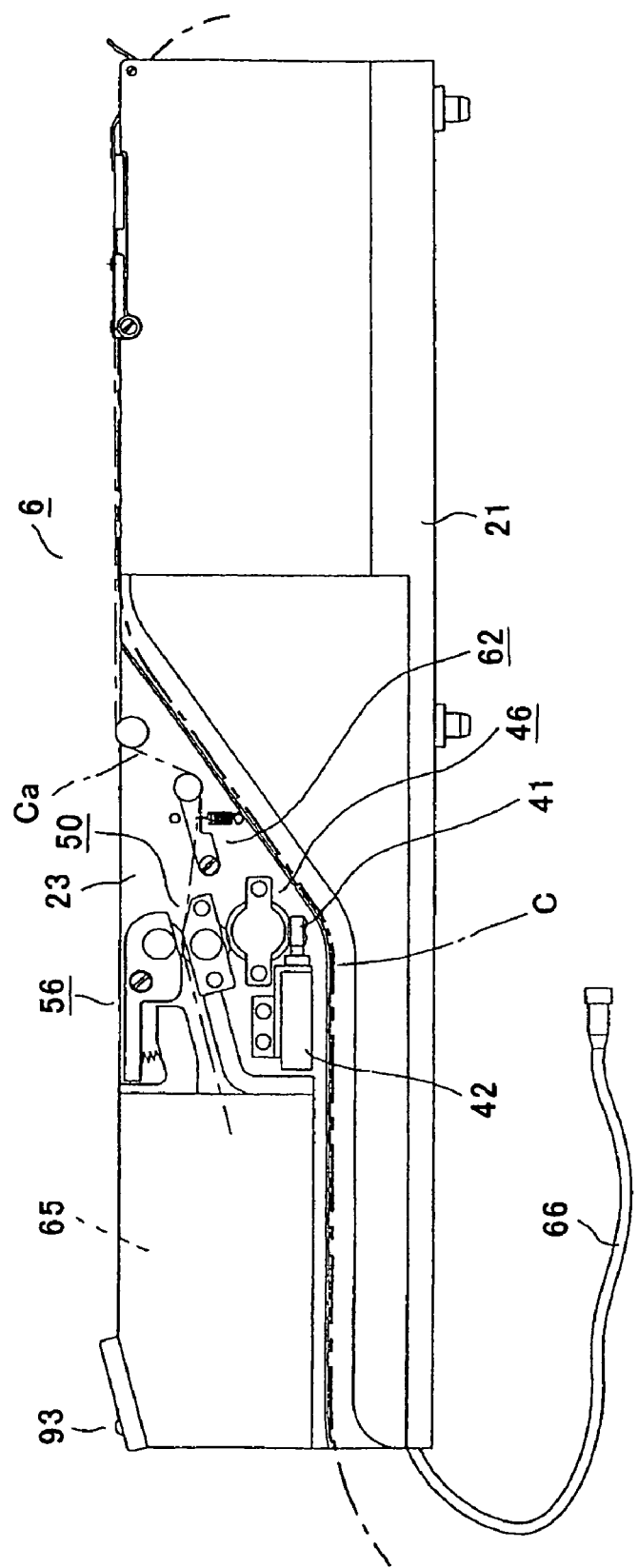
FIG. 2 is a side view of a component feeding unit of the apparatus of FIG. 1.

Next, the component feeding unit 6 will be described based on FIGS. 2 and 3. The component feeding unit 6 can employ, for example, four types of the storage tapes C, i.e., the storage tapes storing electronic components aligned at 4 mm pitches, 8 mm pitches, 12 mm pitches and 16 mm pitches. The component feeding unit 6 includes a unit frame 21, a storage tape reel (not shown) rotatably mounted on the unit frame 21, a tape feeding system 22 for intermittently feeding the storage tape C let out from the storage tape reel reeled with the storage tape C to a position where the electronic component A is picked up by the suction nozzle 18, a cover tape peeling system 23 for peeling a cover tape Ca from the storage tape C just before the pickup position, and a shutter system 24 which enables picking-up of the electronic component A by opening above the electronic component A fed to the pickup position.

The storage tape C let out from the storage tape reel is fed to the pickup position under a suppressor 27 (shown in FIGS. 8 and 9) which is provided just before the pickup position in a tape route. This suppressor 27 is formed with an opening 27A for picking, and integrated with a shutter 77 of the shutter system 24, which will be described below, near the opening 27A. The suppressor 27 is formed with a slit 28 on one side of the shutter 77. The cover tape Ca of the storage tape C is peeled off at the slit 28, and stored in a storage portion 65 of the cover tape peeling system 23, which will be described below. That is, the electronic component A stored in the storage tape C is fed to a position under the shutter 77, which opens and closes the opening 27A for picking, with the cover tape Ca being peeled off.

Figure 3:
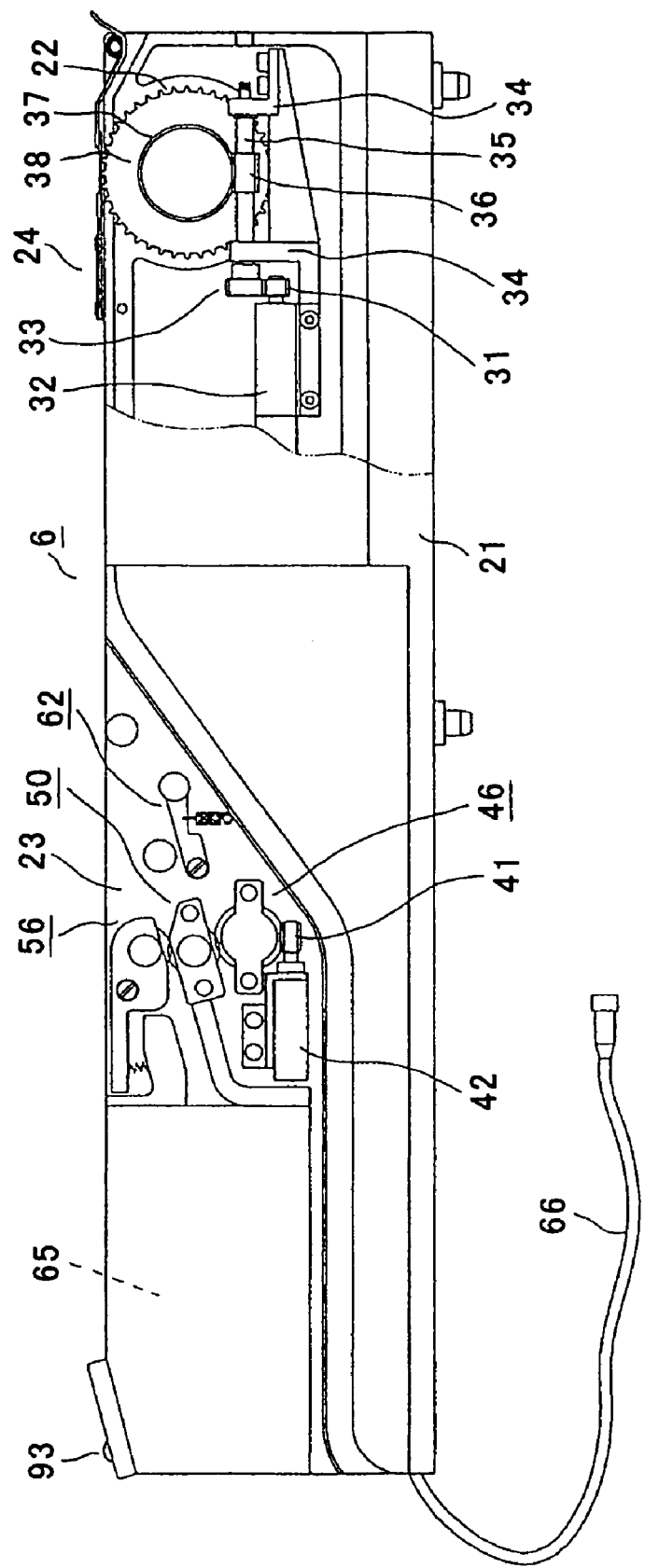
FIG. 3 is a partial side view of the component feeding unit of the apparatus of FIG. 1.

As shown in FIG. 3, the tape feeding system 22 includes a drive motor 32 provided with a gear 31 at its output axis, a rotation axis 35 rotatbly supported by both supporting bodies 34 and provided with a gear 33 at its end engaged with the gear 31, and a sprocket 38 provided with a worm wheel 37 engaged with a worm gear 36 provided in a center of the rotation axis 35 and also engaged with feed holes Cb formed in the storage tape C to feed the storage tape C. Therefore, when the drive motor 32 is driven, the rotation axis 35 rotates through the gear 31 and the gear 33, and the sprocket 38 intermittently rotates by a predetermined angle through the worm gear 36 and the worm wheel 37. Then, the storage tape C is intermittently fed by the feed holes Cb.

Figure 4:
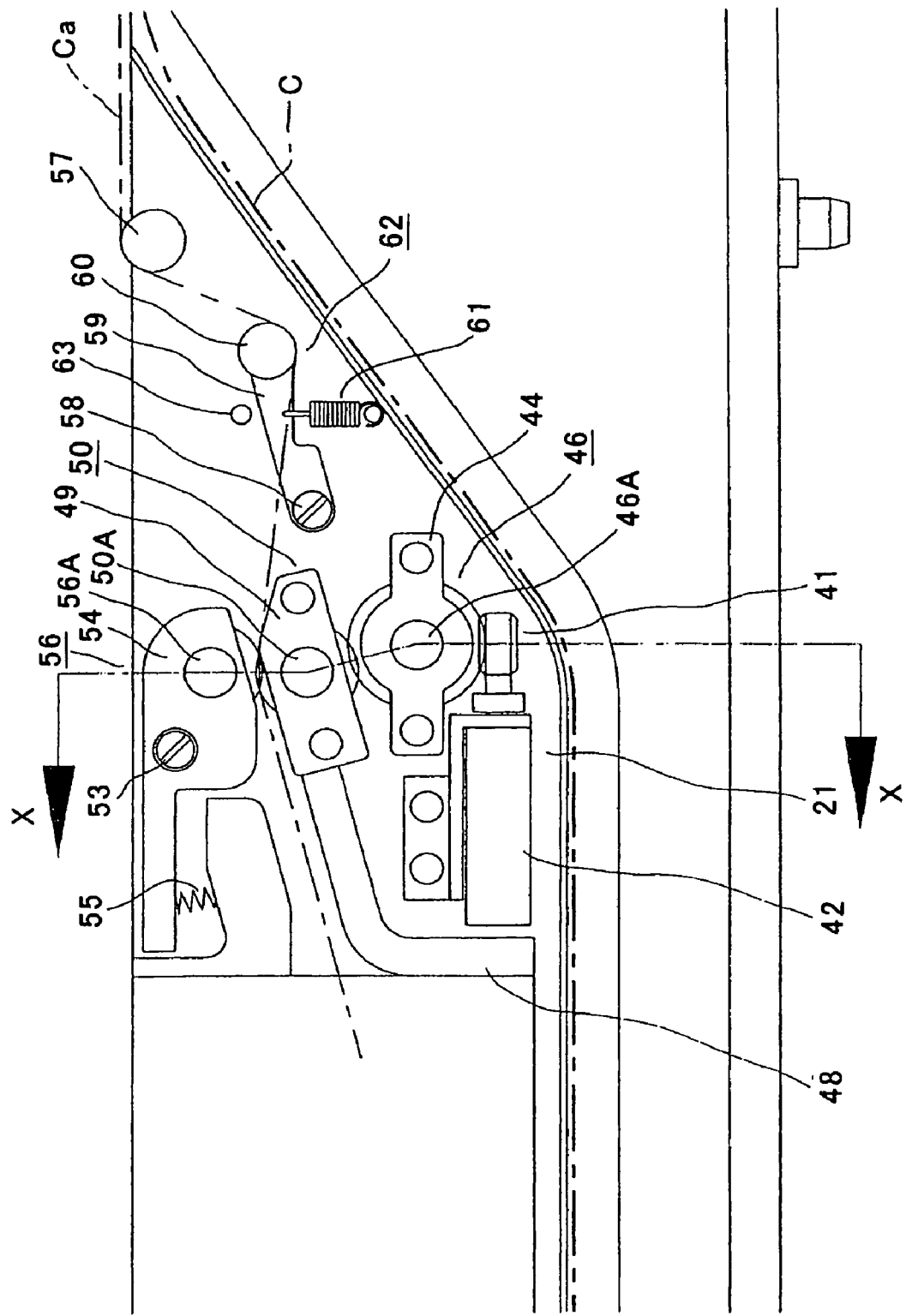
FIG. 4 is an enlarged view of a cover tape peeling system of the apparatus of FIG. 1.
Figure 5:
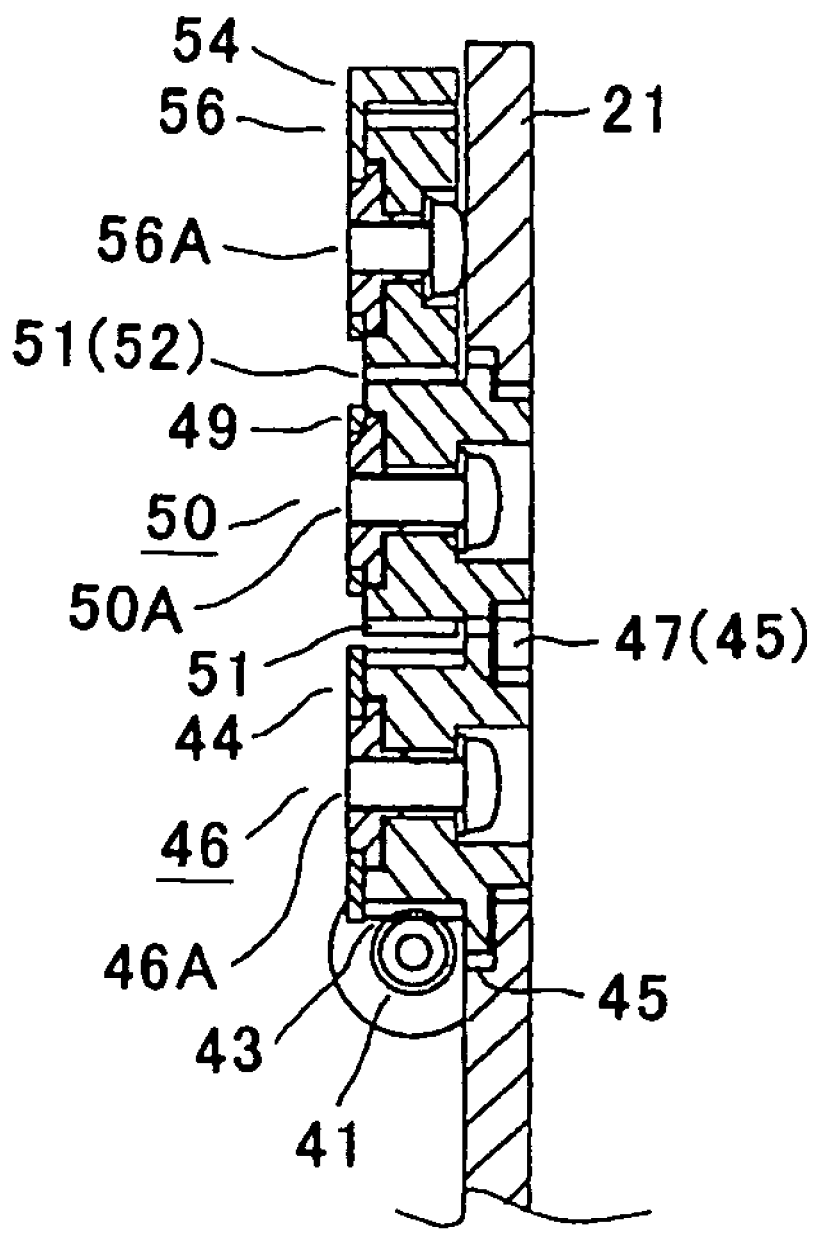
FIG. 5 is a cross-sectional view along line X-X of FIG. 4.

As shown in FIGS. 3 to 5, the cover tape peeling system 23 includes a drive motor 42, a first rotating body 46, a second rotating body 50, a third rotating body 56, a roller 57, and a tension applying body 62. The drive motor 42 is provided with a worm gear 41 at its output axis. The first rotating body 46 is provided with a gear 43 engaged with a gear 45 and the gear 41 therearound, and is rotatably supported by a supporting body 44 through a support axis 46A, the supporting body 44 being fixed on the unit frame 21. The second rotating body 50 is provided with a gear 47 engaged with a contact portion 51 and the gear 45 therearound, and is rotatably supported by a supporting body 49 through a support axis 50A, the supporting body 49 being fixed on the unit frame 21 through an attachment body 48. The third rotating body 56 is provided with a contact portion 52 contacting with the contact portion 51 being pushed by a spring 55 therearound, and is rotatably supported by an attachment body 54 through a support axis 56A, the attachment body 54 being fixed on the unit frame 21 and rotatable through a support axis 53. The roller 57 is provided for guiding the cover tape Ca. The tension applying body 62 is provided with a roller 60 for guiding the cover tape Ca guided by the roller 57 on an end of an attachment body 59, the attachment body 59 being fixed on the unit frame 21 and rotatable around a support axis 58, and applies tension to the cover tape Ca being pushed by a spring 61. A numeral 63 designates a stopper for limiting rotation of the attachment body 59 there.

When the cover tape Ca is peeled off, the drive motor 42 is driven to rotate the first rotating body 46 through the gears 41 and 43. By the rotation of the first rotating body 46, the second rotating body 50 rotates through the gears 45 and 47. By rotation of the second rotating body 50, the third rotating body 56 rotates with the cover tape Ca being interposed between the contact portions 52 and 51 pushed by the spring 55. Then, the cover tape Ca is peeled from the storage tape C by a pitch at the slit 28 of the suppressor 27 without generating the slack, and is stored in a storage portion 65 provided in an end of the component feeding unit 6.

Figure 6:
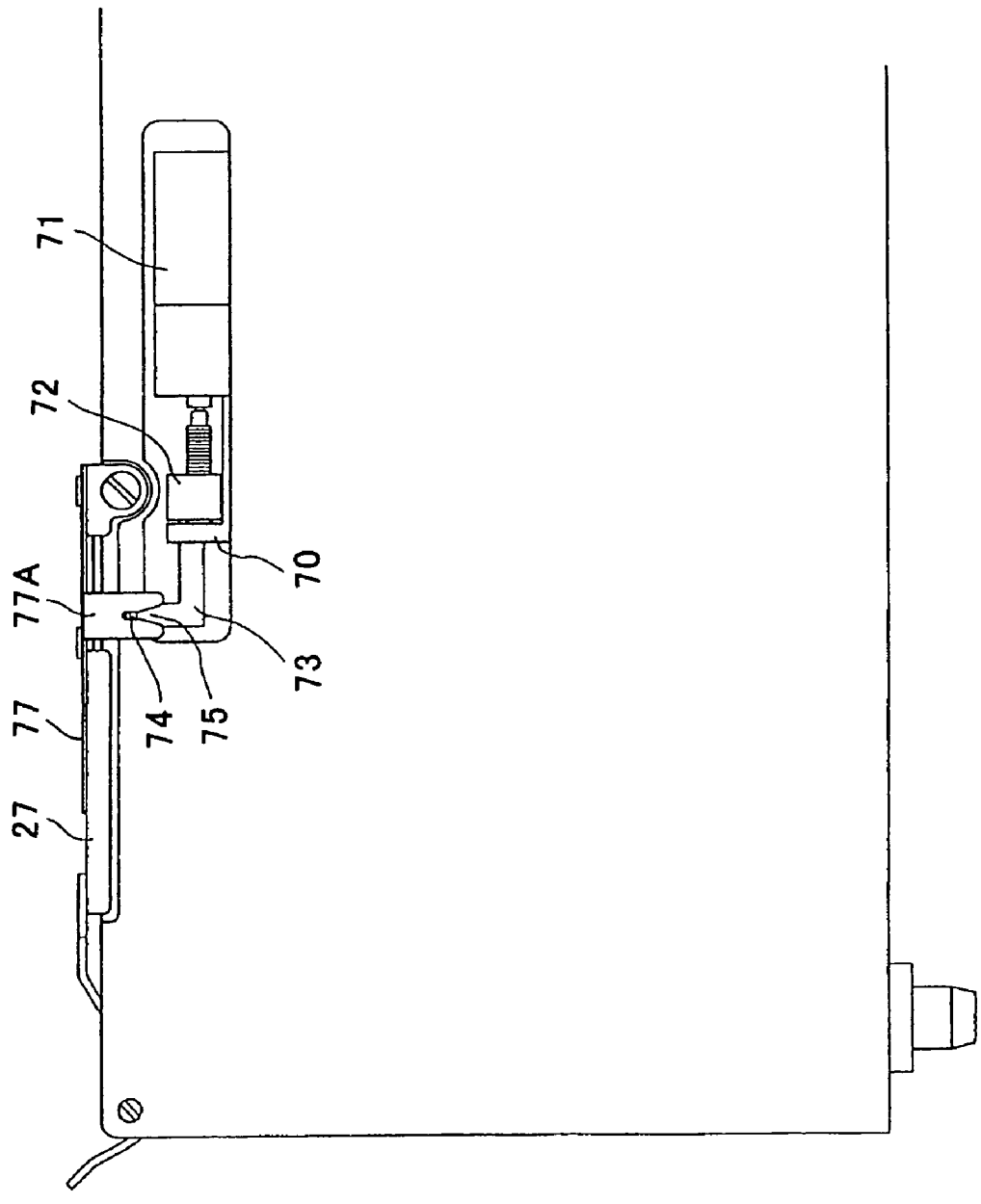
FIG. 6 is a side view of a shutter system of the component feeding unit of FIG. 2 when a shutter is closed.
Figure 7:
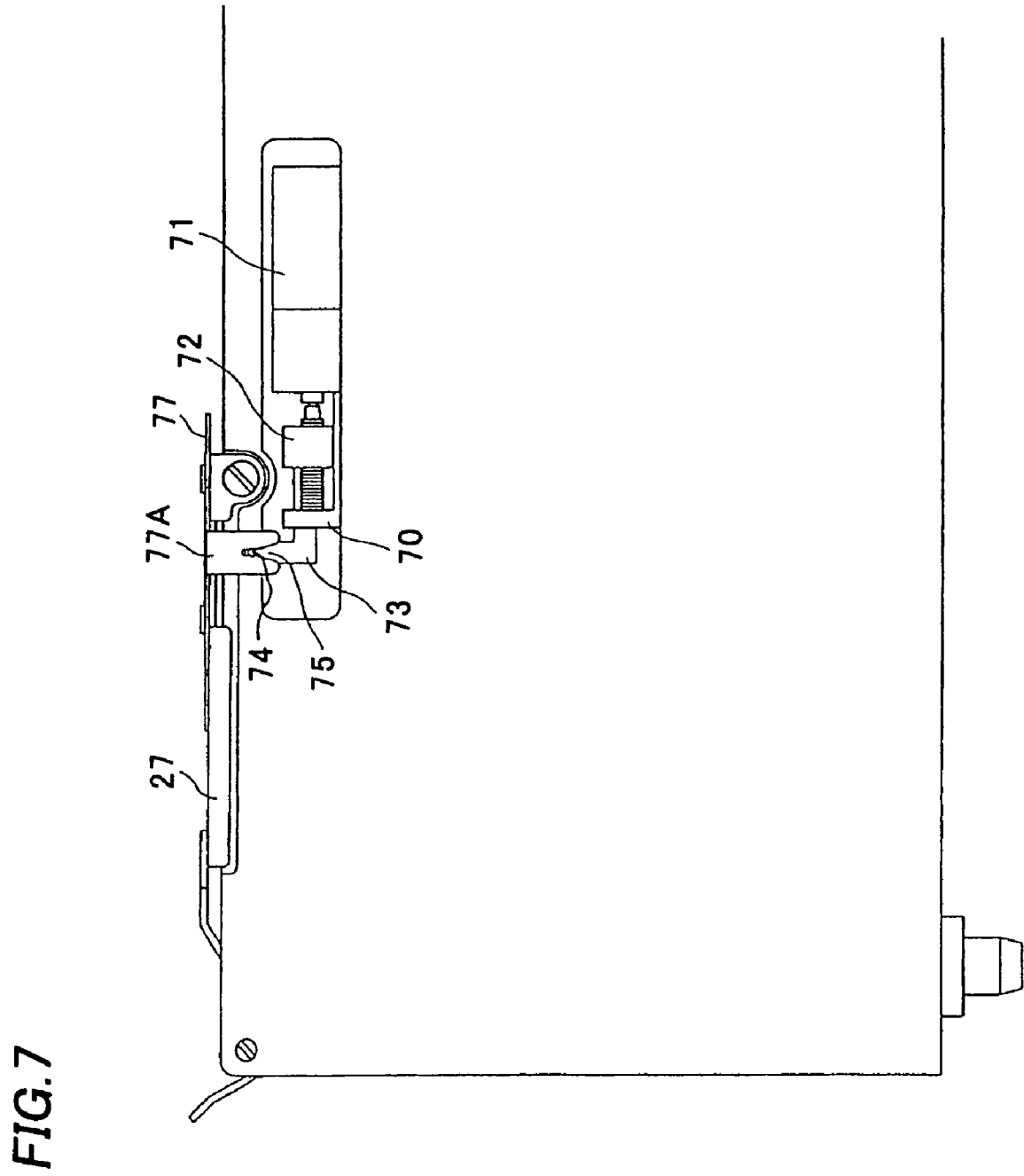
FIG. 7 is a side view of the shutter system of FIG. 6 when the shutter is open.

As shown in FIGS. 6 and 7, the shutter system 24 includes a drive motor 71 having an output axis as a screw axis supported by a supporting body 70 at its end, an operation body 73 fixed to a nut body 72 engaged with the screw axis, and a shutter 77 slidably provided on the suppressor 27. The shutter 77 has a bending piece 77A formed with a groove 75 to be fit with a pin 74 protruding from the operation body 73, and has a fitting piece 76 fitted in a guide groove 27B provided in the suppressor 27, being slidable on the suppressor 27. For opening or closing the opening 27A for picking by shifting the shutter 77, the drive motor 71 is driven to shift the nut body 72 engaged with the screw axis and the operation body 73, and then shift the fitting piece 76 along the guide groove 27B, so that the shutter 77 shifts to open or close the opening 27A.

When the shutter 77 is shifted to a closing position (FIG. 8), the shutter 77 closes the opening 27A, preventing the electronic component A fed to the pickup position from jumping out of the storage portion D of the storage tape C which the cover tape Ca is peeled from. When shifted to an opening position (FIG. 9), the shutter 77 recedes from above the electronic component A to enable picking of the component A by the suction nozzle 18.

The storage portion D is formed relatively large to have some room for storing the electronic component. A numeral 66 designates a power supply line for supplying power to the drive motors 32, 42 and 71.

Next, timings of feeding of the storage tape C, peeling of the cover tape Ca, and opening or closing of the shutter 77 will be described. The storage tape C is fed by the tape feeding system 22 by one pitch, and simultaneously with this, the cover tape peeling system 23 intermittently peels the cover tape Ca from the storage tape C by one pitch. Then, as the tape feeding system 22 and the cover tape peeling system 23 stop, the shutter system 24 performs opening operation to open the shutter 77 above the electronic component A fed to the pickup position.

As the shutter 77 opens, the mounting head 16 picks the electronic component A up. Then, the shutter 77 closes, and simultaneously with this, the next feeding of the storage tape and the next peeling of the cover tape Ca are performed.

Figure 8:
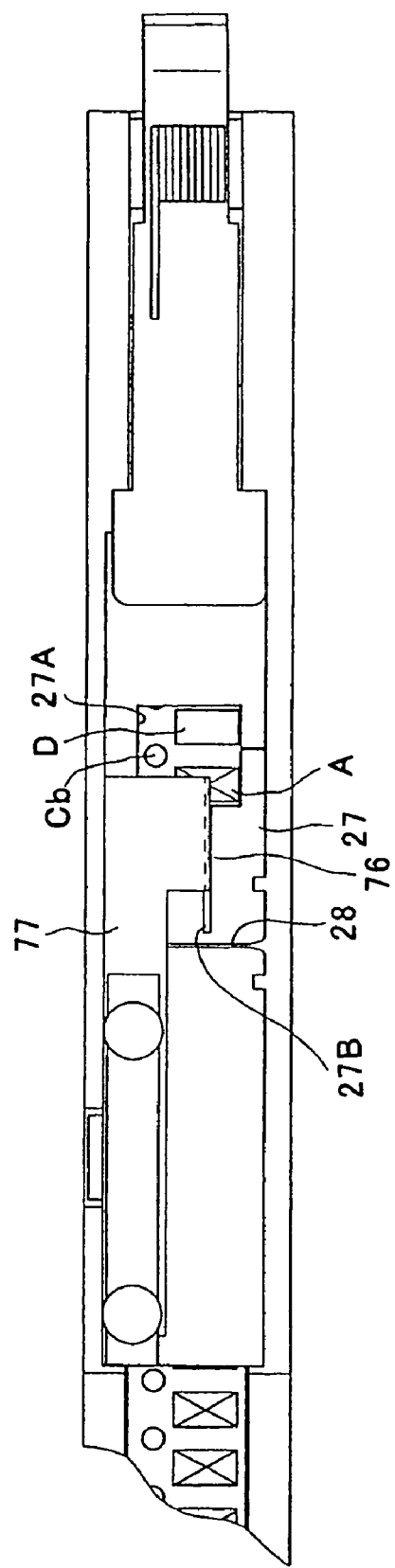
FIG. 8 is a plan view of a main portion of the component feeding unit of FIG. 2 when the shutter is closed.
Figure 9:
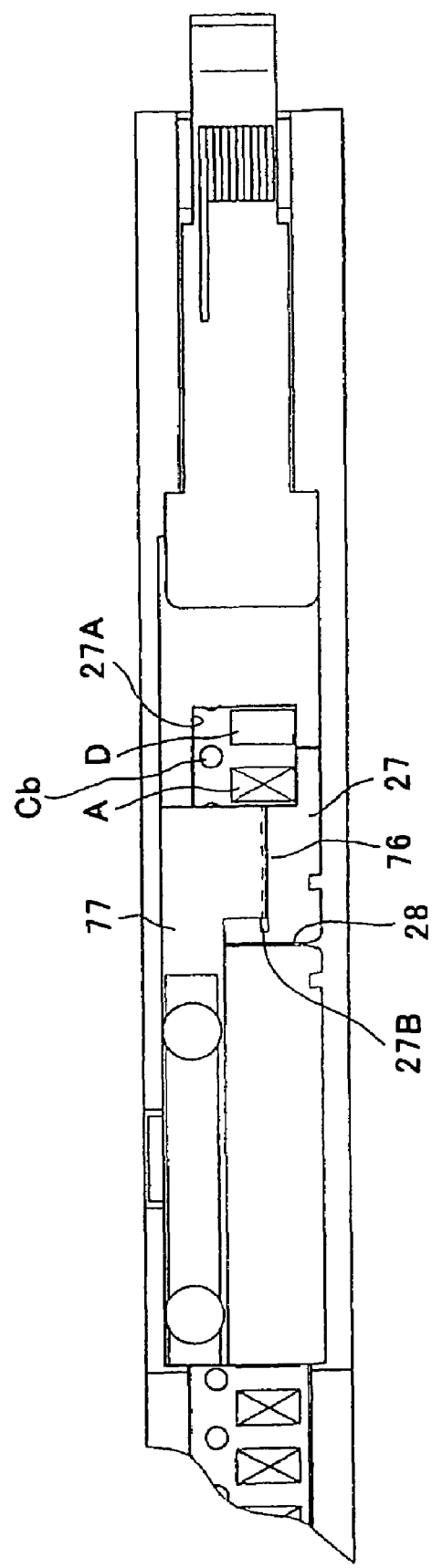
FIG. 9 is a plan view of the main portion of FIG. 8 when the shutter is open.

Here, as described above, the component feeding unit 6 can employ four types of the storage tapes C, that is, the storage tapes storing the electronic components aligned at 4 mm pitches, 8 mm pitches, 12 mm pitches and 16 mm pitches. Therefore, the opening 27A for picking in the suppressor 27 is formed in a size corresponding to the electronic component A stored in the storage tape of 16 mm pitch. Accordingly, if a small electronic component stored in the storage tape of 4 mm pitch is positioned in the center of the opening 27A in a feeding direction of the storage tape C, as is the case with the conventional art shown in FIG. 10A, the component jumps in the middle of the opening 27A. The term "jump" here means that the component moves vertically in the opening 27A. Since the component is located in the middle of the opening 27A, the component and the storage tape that contains it moves relatively unconstrained and thus the component may be misplaced in the tape or jump out of the tape because of the movement. To prevent such a adverse movement of the component, in this embodiment, a feed stop position K of a head electronic component A in the storage tape C, where a head electronic component stored in the storage tape C in the component feeding unit 6 is picked up, is set on an upstream side of the opening 27A as shown in FIG. 8 and FIG. 10B. In this context, a head electronic component is an electronic component that comes to the pick-up position first after the mounting apparatus starts to use a new storage tape for the mounting operation. This enables stably feeding of the electronic components A, prevents the storage tape C from jumping at the center of the opening 27A, and thus prevents affecting of the behavior of the head electronic component A in the storage tape C. The setting of the electronic component A at the upstream side of the opening 27A will be described as follows.

Figure 11:
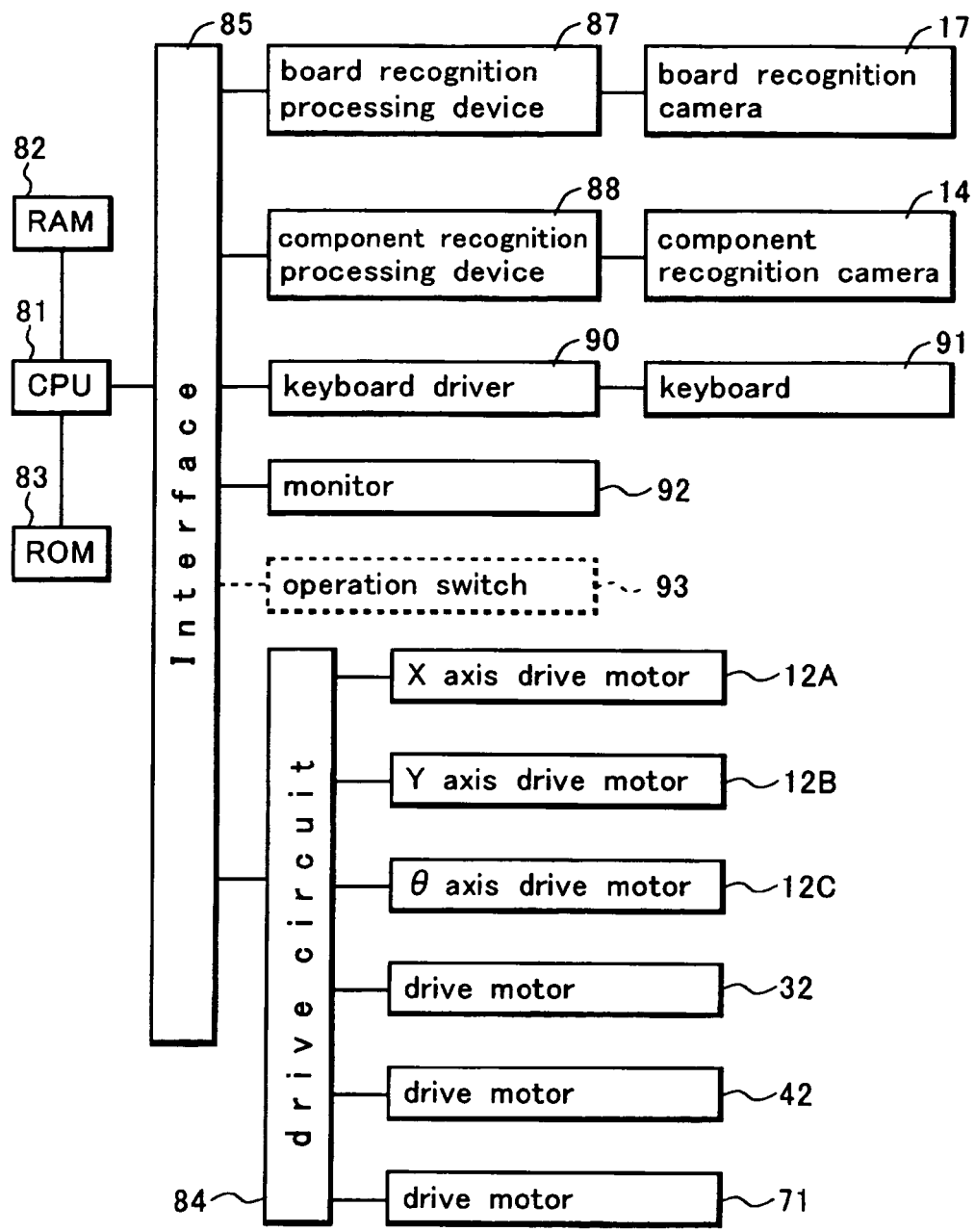
FIG. 11 is a control block diagram of the electronic component mounting apparatus of FIG. 1.

First, a control block diagram of the electronic component mounting apparatus will be described based on FIG. 11. A numeral 81 designates a CPU as a control device for controlling operations relating to the mounting operation of the electronic component mounting apparatus. A numeral 82 designates a RAM (random access memory) for storing data, such as a position in X and Y directions and at angle in the printed board P, an alignment number of each of the component feeding devices, and a position of a positioning mark (not shown) provided on the printed board P, in mounting order of the electronic components A. A numeral 83 designates a ROM (read only memory).

The CPU 81 totally controls the operation relating to the component mounting operation of the electronic component mounting apparatus based on data stored in the RAM 82 and according to a program stored in the ROM 83. That is, the CPU 81 controls the X axis drive motor 12A and the Y axis drive motor 12B of the XY stage 12, and the θ axis drive motor 12C of the suction nozzle 18 through a drive circuit 84 and an interface 85.

A numeral 87 designates a board recognition processing device connected with the CPU 81 through the interface 85. The board recognition processing device 87 recognizes an image taken and stored by the board recognition camera 17, and sends a recognition result to the CPU 81. That is, the CPU 81 outputs a command of recognizing an image at the board positioning mark (e.g. calculating a shifted amount from a proper position) taken by the board recognition camera 17, to the board recognition processing device 87, and receives a recognition result from the board recognition processing device 87. Furthermore, the CPU 81 outputs a command of recognizing an image of the electronic component A positioned in the opening 27A (e.g. calculating a shifted amount from a proper position) taken by the board recognition camera 17, to the board recognition processing device 87, and receives a recognition result from the board recognition processing device 87. Since the board recognition camera 17 takes an image of the opening 27A, it is not necessary to provide another recognition camera.

A numeral 88 designates a component recognition processing device connected with the CPU 81 through the interface 85. The component recognition processing device 88 recognizes an image of the electronic component A being picked up by the suction nozzle 18, which is taken and stored by the component recognition camera 14, and sends a recognition result to the CPU 81. That is, the CPU 81 outputs a command of recognizing the electronic component image (e.g. calculating a shifted amount from a proper position) taken by the component recognition camera 14 to the component recognition processing device 88, and receives the recognition result from the component recognition processing device 88.

A numeral 91 designates a keyboard as an input device connected with the CPU 81 through a keyboard driver 90 and the interface 85. A numeral 92 designates a monitor for displaying images of the electronic component A and so on. Note that other input device such as a touch panel can be substituted for the keyboard 90. The drive motors 32, 42 and 71 of the component feeding unit 6 are also connected with the CPU 81 through the drive circuit 84 and the interface 85.

Under the described structure, the operation for setting of the feed stop position K of the head electronic component A in the storage tape C and a component pickup position of the suction nozzle 18 on the upstream side of the opening 27A will be described.

First, an operator sets a tape of, for example, 8 mm pitch on the component feeding unit 6, and operates the keyboard 91 to drive the drive motors 32, 42, and 71 through the CPU 81 and intermittently feed the storage tape C pitch by pitch. When the storage tape C is fed by one pitch, the shutter 77 opens, then the board recognition camera 17 takes an image of the opening 27A, and the board recognition processing device 87 recognizes the image taken. Then, if the electronic component A is not recognized in the opening 27A, the CPU 81 repeats the driving operation of the drive motors 32, 42, and 71.

When the head electronic component A in the storage tape C is recognized in the opening 27A, the CPU 81 controls the drive motors 32, 42, and 71 so that the feed stop position K of the electronic component A is on the upstream side of the opening A (FIG. 10B). This control is performed based on a recognition result for the electronic component A positioned in the opening 27A, which is calculated out when the board recognition processing device 87 recognizes the image of the opening 27A taken by the board recognition camera 17 when the shutter 77 opens.

Figure 10A:
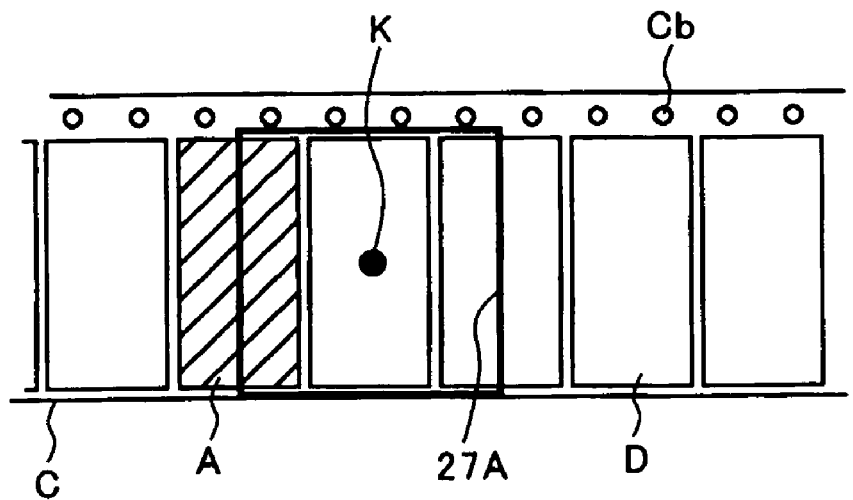
FIGS. 10A and 10B show feeding operations of a storage tape of 8 mm pitch.
Figure 10B:
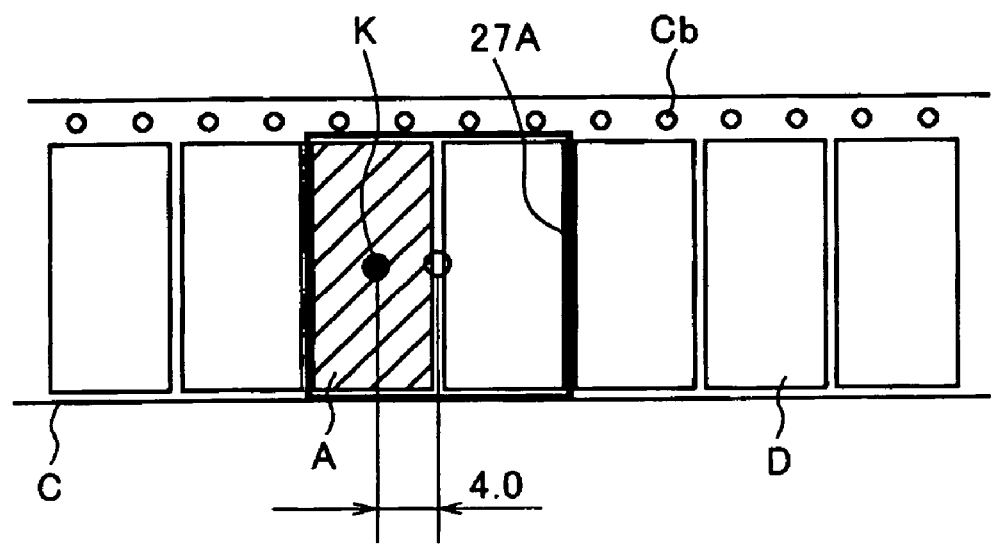

That is, when a half of the head electronic component A is recognized on the upstream side of the opening 27A in recognition processing as shown in FIG. 10A, the CPU 81 controls the drive motors 32, 42, and 71 so as to feed the storage tape C by 4 mm (half of a pitch) at first (FIG. 10B).

Conventionally, the component pickup position K of the suction nozzle 18, which is set by moving the X axis drive motor 12A and the Y axis drive motor 12B, has been in a center of the opening 27A (FIG. 10A). In this embodiment, however, the component pickup position K of the suction nozzle 18 is shifted to the upstream side from the center of the opening 27A by 4 mm (FIG. 10B) correspondingly to correction of the feed stop position K of the electronic component A. This enables stably feeding of the electronic component, and prevents the storage tape C from jumping and thus prevents affecting of the behavior of the electronic component A in the storage tape C.

Figure 12A:
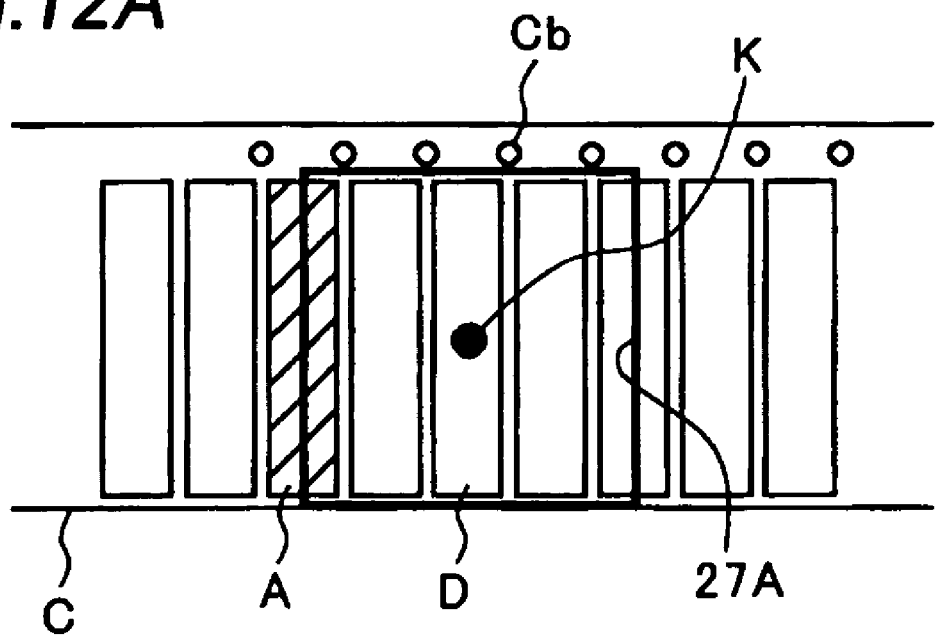
FIGS. 12A and 12B show feeding operations of a storage tape of 4 mm pitch.
Figure 12B:
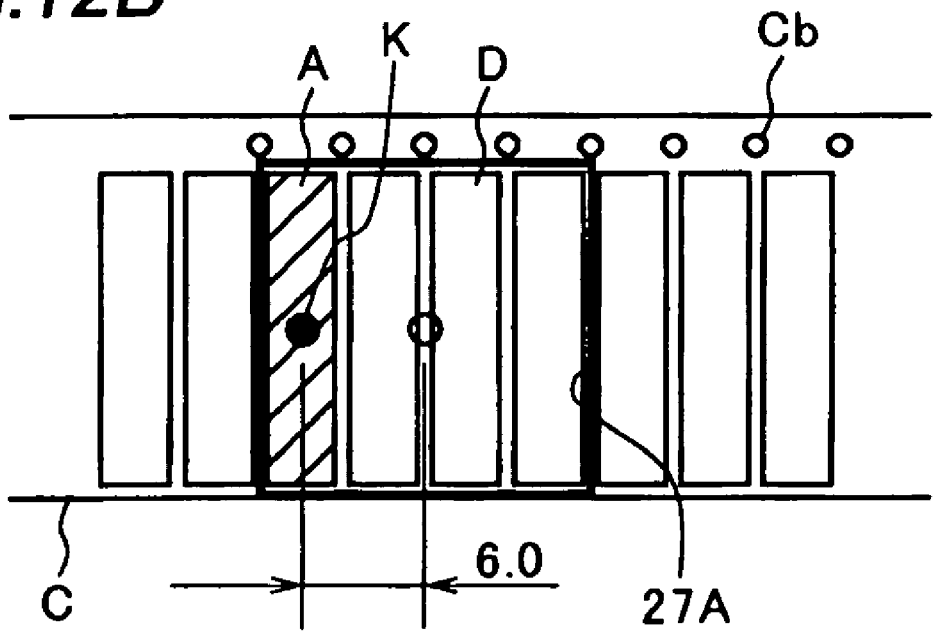

When the storage tape of, for example, 4 mm pitch is employed as shown in FIGS. 12A and 12B, the feed stop position K of the electronic component A in the storage tape C in the component feeding unit 6, where the head electronic component A is to be picked up, has been conventionally in the center of the opening 27A (FIG. 12A). In the embodiment, the storage tape C is fed pitch by pitch by driving the drive motors 32, 42, and 71 by operating the keyboard 91 first, in the same manner for the storage tape of 8 mm pitch. When the storage tape C is fed by one pitch, the shutter 77 opens, then the board recognition camera 17 takes an image of the opening 27A, and the board recognition processing device 87 recognizes the image taken. Then, if the electronic component A is not recognized in the opening 27A, the CPU 81 repeats the driving operation of the drive motors 32, 42, and 71.

When the head electronic component A in the storage tape C is recognized in the opening 27A, the CPU 81 controls the drive motors 32, 42, and 71 so that the feed stop position K of the electronic component A is on the upstream side of the opening 27A. This control is performed based on a recognition result for the electronic component A positioned in the opening 27A, which is calculated out when the board recognition processing device 87 recognizes the image of the opening 27A taken by the board recognition camera 17 when the shutter 77 opens. (FIG. 12B).

That is, when only half of the head electronic component A is recognized on the upstream side of the opening 27A as shown in FIG. 12A in the recognition process, the CPU 81 controls the drive motors 32, 42, and 71 to feed the storage tape C by 2 mm (half of a pitch) and to position the feed stop position K of the head electronic component A on the upstream side of the opening 27A, at first (FIG. 12B). Simultaneously with this, the component pickup position K of the suction nozzle 18, which is set by the X axis drive motor 12A and the Y axis drive motor 12B, is shifted to the upstream side from the center of the opening 27A by 6 mm. From the next operation, the storage tape C is intermittently fed by 4 mm pitches, and the feed stop position K and the pickup position K are set in the above corrected position (FIG. 12B).

Figure 13:
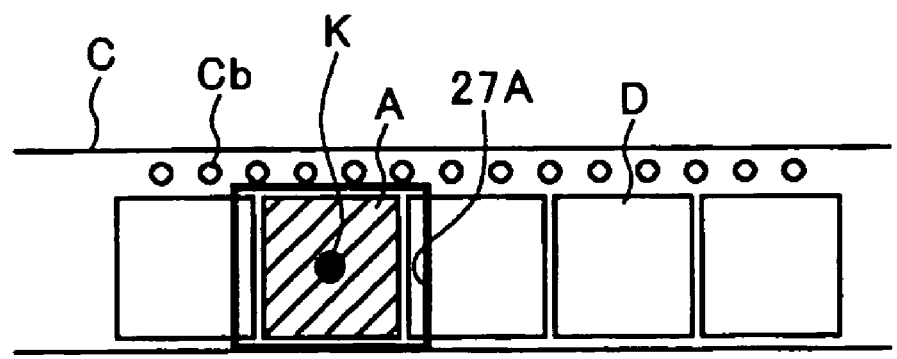
FIG. 13 shows a feeding operation of a storage tape of 12 mm pitch.
Figure 14:
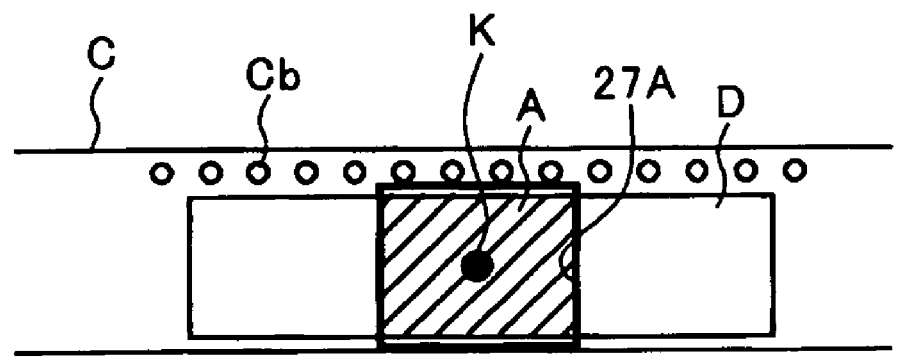
FIG. 14 shows a feeding operation of a storage tape of 16 mm pitch.

When the storage tape C of 21 mm pitch or 16 mm pitch is used, the feed stop position K of the head electronic component A in the storage tape C, where the component A is picked up by the suction nozzle 18, remains in the center of the opening 27A as conventional (FIGS. 13 and 14).

Next, other embodiment of the invention will be described. As shown in FIGS. 2 and 3, an operation switch 93 is provided on an upper rear end of the component feeding unit 6. Then, an operator sets the storage tape C of, for example, 8 mm pitch in the component feeding unit 6, and operates the keyboard 91 to drive the drive motors 32, 42, and 71 through the CPU 81 to intermittently feed the storage tape C pitch by pitch. When the storage tape C is fed by one pitch, the shutter 77 opens, then the board recognition camera 17 takes an image of the opening 27A, and the board recognition processing device 87 recognizes the image taken. If the electronic component A is not positioned in the opening 27A based on the recognition result, the CPU 81 repeats the driving operation of the drive motors 32, 42, and 71.

When the board recognition processing device 87 recognizes the image of the opening 27A taken by the board recognition camera 17 as the shutter 77 opens, the image of the opening 27A is displayed on the monitor 92. If the head electronic component A of the storage tape C is positioned in the opening 27A, the operator operates the operation switch 93 while observing the image displayed on the monitor 92. Then, the operator operates on the operation switch 93 to advance the storage tape pitch by pitch using a predetermined small pitch, for example, 2 mm. The CPU 81 drives the drive motors 32, 42, and 71 by the predetermined pitch based on the operator's instructions to set the feed stop position K of the electronic component A on the upstream side of the opening 27A. At this time, since a driving amount of each of the drive motors for one pushing operation of the operation switch 93 is set at the predetermined amount, the head electronic component A in the storage tape C is intermittently fed by the predetermined pitch by pushing operations of the operation switch 93. When the operator fails to set the head electronic component at a proper upstream position, i.e., the head electronic component is inadvertently advanced beyond the proper position, the operator may use the electronic component following the head electronic component for the positioning. Therefore, when the electronic component A is small, the feed stop position K of the head electronic component A in the storage tape C and the pickup position K of the suction nozzle 18 can be accurately positioned on the upstream side of the opening 27A (FIG. 10B).

Incidentally, although a shifting stroke of the shutter 77 in the shutter system 24 is not changed correspondingly to the types of the storage tapes C in the embodiments, it can be changed. Furthermore, although a so-called multifunctional chip mounter is employed as an example of the electronic component mounting apparatus for describing the embodiments, the invention is not limited to this but can be applied to a high speed chip mounter of rotary table type. Furthermore, this invention can be applied to a variety of the component feeding units which is adaptable to storage tapes of different tape width.

Although particular preferred embodiments of the invention have been disclosed in detail, it will be recognized that variations or modifications of the disclosed apparatus are possible based on the disclosure for those skilled in the art and lie within the scope of the present invention. For example, the control device for the motors 32, 42, and 71 can be provided in the component feeding unit instead of in the component mounting apparatus.

What is claimed is:

1. An electronic component feeding device comprising:
   a tape feeding system provided with a drive source enabling an intermittent feeding of a storage tape stored with electronic components to a component pickup position, the tape feeding system being adjustable to a plurality of pitches corresponding to sizes of the electronic components;

a suppressor formed with an opening disposed at the component pickup position; and a control device setting a feed stop position of the electronic components in the storage tape so that an electronic component is positioned closer to an edge of the opening than a center of the opening with respect to a feeding direction of the storage tape, wherein the control device is configured to set only one feed stop position for the electronic components in the storage tape by using a head electronic component of the storage tape and to control the drive source so that the intermittent feeding of a storage tape stops at the only one feed stop position.

2. The electronic component feeding device of claim 1, further comprising a shutter disposed over the opening of the suppressor and configured to open when the electronic component is picked up by a suction nozzle.

3. An electronic component feeding device comprising:

a tape feeding system provided with a drive source enabling an intermittent feeding of a storage tape stored with electronic components to a component pickup position, the tape feeding system being adjustable to a plurality of pitches corresponding to sizes of the electronic components;

a suppressor formed with an opening disposed at the component pickup position; and a control device setting a feed stop position of the electronic components in the storage tape so that an electronic component is positioned closer to an edge of the opening than a center of the opening with respect to a feeding direction of the storage tape, wherein the control device is configured to set only one feed stop position for the electronic components in the storage tape by using a head electronic component of the storage tape, and the control device is configured to set the feed stop position of the electronic components in the storage tape so that the electronic component is positioned closer to the edge than the center of the opening when the electronic component is smaller than a predetermined size and the control device changes the feed stop position to the center of the opening when the electronic component is larger than the predetermined size.

4. The electronic component feeding device of claim 1, wherein the opening is configured so that the electronic component is picked up by a suction nozzle.

5. The electronic component feeding device of claim 1, further comprising a recognition camera taking an image of the electronic component stored in the storage tape through the opening and a recognition processing device recognizing the image taken by the recognition camera, wherein the control device sets the feed stop position based on a recognition result by the recognition processing device.

6. The electronic component feeding device of claim 1, further comprising a recognition camera taking an image of the electronic component stored in the storage tape through the opening, an image display device displaying the image taken by the recognition camera and an operating portion that is operated by an operator based on the image displayed on the image display device, wherein the control device sets the feed stop position based on an operation of the operating portion by the operator.

* * * * *